US008466012B1

(12) United States Patent
Chang et al.

(10) Patent No.: US 8,466,012 B1
(45) Date of Patent: Jun. 18, 2013

(54) BULK FINFET AND SOI FINFET HYBRID TECHNOLOGY

(75) Inventors: Josephine B. Chang, Mahopac, NY (US); Leland Chang, New York, NY (US); Chung-Hsun Lin, White Plains, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/364,036

(22) Filed: Feb. 1, 2012

(51) Int. Cl.
    *H01L 21/00* (2006.01)
(52) U.S. Cl.
    USPC ........... 438/149; 257/347; 257/352; 257/507; 257/E21.598; 257/E27.112
(58) Field of Classification Search
    USPC .......... 438/149; 257/347, 352, 507, E21.598, 257/E27.112
    See application file for complete search history.

(56) References Cited

U.S. PATENT DOCUMENTS

| | | | |
|---|---|---|---|
| 5,963,817 A | 10/1999 | Chu et al. | |
| 6,949,768 B1 * | 9/2005 | Anderson et al. | 257/74 |
| 6,998,684 B2 * | 2/2006 | Anderson et al. | 257/351 |
| 7,101,763 B1 | 9/2006 | Anderson et al. | |
| 7,393,733 B2 | 7/2008 | Currie | |
| 7,439,109 B2 * | 10/2008 | Anderson et al. | 438/150 |
| 7,667,248 B2 | 2/2010 | Booth, Jr. et al. | |
| 7,777,275 B2 * | 8/2010 | Lee | 257/347 |
| 7,803,670 B2 | 9/2010 | White et al. | |
| 7,880,231 B2 * | 2/2011 | Chang | 257/347 |
| 7,911,002 B2 * | 3/2011 | Thean et al. | 257/369 |
| 2004/0119100 A1 * | 6/2004 | Nowak et al. | 257/204 |
| 2005/0189589 A1 | 9/2005 | Zhu et al. | |
| 2005/0224875 A1 * | 10/2005 | Anderson et al. | 257/347 |
| 2006/0049460 A1 * | 3/2006 | Chen et al. | 257/347 |
| 2006/0084212 A1 * | 4/2006 | Anderson et al. | 438/197 |
| 2007/0099361 A1 * | 5/2007 | Thean et al. | 438/197 |
| 2008/0020515 A1 * | 1/2008 | White et al. | 438/118 |
| 2008/0090397 A1 * | 4/2008 | Brask et al. | 438/592 |
| 2008/0111190 A1 * | 5/2008 | Chang | 257/350 |

(Continued)

OTHER PUBLICATIONS

Simonen et al., "Comparison of Bulk and SOI CMOS Technologies in a DSP Processor Circuit Implementation," Digital and Computer Systems Laboratory, Tampere University of Technology, Tampere, Finland, the 13th International Conference on Microelectronics (ICM 2001), Oct. 29-31, 2001, pp. 107-110.

(Continued)

*Primary Examiner* — Kyoung Lee
*Assistant Examiner* — Ankush Singal
(74) *Attorney, Agent, or Firm* — Vazken Alexanian; Michael J. Chang, LLC

(57) ABSTRACT

Hybrid bulk finFET and SOI finFET devices and methods for fabrication thereof are provided. In one aspect, a method for fabricating a CMOS circuit having SOI finFET and bulk finFET devices includes the following steps. A wafer is provided having an active layer separated from a substrate by a BOX. Portions of the active layer and BOX are removed in a second region of the wafer so as to expose the substrate. An epitaxial material is grown in the second region of the wafer templated from the substrate. Fins are etched in the active layer and in the epitaxial material using fin lithography hardmasks. Gate stacks are formed covering portions of the fins which serve as channel regions of the SOI finFET/bulk finFET devices. An epitaxial material is grown on exposed portions of the fins which serves as source and drain regions of the SOI finFET/bulk finFET devices.

21 Claims, 7 Drawing Sheets

U.S. PATENT DOCUMENTS

2009/0159972 A1* 6/2009 Jakschik et al. .............. 257/350
2010/0163971 A1* 7/2010 Hung et al. .................. 257/327
2012/0083107 A1* 4/2012 Chang et al. .................. 438/585

OTHER PUBLICATIONS

Wang et al., "BOI (Body-on-Insulator) FinFETs on Bulk Si Wafers: Simulation and Fabrication," Institute of Microelectronics, Peking University, Beijing 100871, China, 214th ECS Meeting, Oct. 12-Oct. 17, 2008, Honolulu, HI.

Robert Simonton, "Special Report SOI Wafer Technology for CMOS ICs," Robert Simonton, President Simonton Associates, pp. 1-11 (2002).

Fried et al., "Comparison study of FinFETs: SOI vs. bulk; Performance, Manufacturing Viability and Cost," Horacio Mendez, SOI Industry Consortium (2009).

B. Yu et al., "FinFET Scaling to 10nm Gate Length," IEDM (2002).

* cited by examiner

BULK FINFET AND SOI FINFET HYBRID TECHNOLOGY

FIELD OF THE INVENTION

The present invention relates to integrated circuits, and more particularly, to hybrid bulk complementary metal-oxide semiconductor (CMOS) fin field-effect transistors (finFETs) and silicon-on-insulator (SOI) finFET devices and methods for fabrication thereof.

BACKGROUND OF THE INVENTION

Continued scaling of complementary metal-oxide semiconductor (CMOS) circuits presents several technical challenges. Scaling with conventional doped planar devices has become increasingly challenging. A finFET architecture offers increased scaling opportunities beyond that attainable with planar devices. See, for example, B. Yu et al., "FinFET Scaling to 10 nm Gate Length," IEDM (2002). A finFET architecture has attractive qualities for device scaling in that no channel doping is required and also that the gate workfunction is not typically bandedge. Also, FinFET devices exhibit fast switching times and high current densities.

Do to ease of fabrication, FinFETs have been mainly produced on silicon-on-insulator (SOI) wafers. However, one potential drawback for SOI finFETs is that, for thicker fins, contacting the body node is structurally challenging. Body node contacts are needed in circuit situations where matching is critical. Also, SOI finFETs will exhibit substantial self-heating, which is a potential concern for IO drivers. On the other hand, with bulk finFETs the fins are typically continuous with the substrate, and bulk finFETs exhibit better heat-transfer properties.

Given the above-described advantages to using a finFET architecture, improved techniques for fabricating finFET devices would be desirable.

SUMMARY OF THE INVENTION

The present invention provides hybrid bulk fin field-effect transistors (finFETs) and silicon-on-insulator (SOI) finFET devices and methods for fabrication thereof. In one aspect of the invention, a method for fabricating a complementary metal-oxide semiconductor (CMOS) circuit having a SOI finFET device and a bulk finFET device is provided. The method includes the following steps. A wafer is provided having an active layer separated from a substrate by a buried oxide (BOX), wherein the wafer has at least a first region and a second region. Portions of the active layer and the BOX are removed in the second region of the wafer so as to expose the substrate. An epitaxial material is grown in the second region of the wafer templated from the substrate. A first fin lithography hardmask is formed on the active layer in the first region of the wafer and a second fin lithography hardmask on the epitaxial material in the second region of the wafer. A plurality of first fins is etched in the active layer using the first fin lithography hardmask and a plurality of second fins in the epitaxial material using the second fin lithography hardmask. A first gate stack is formed covering at least a portion of each of the first fins and a second gate stack is formed covering at least a portion of each of the second fins, wherein the portions of the first fins covered by the first gate stack serve as a channel region of the SOI finFET device and the portions of the second fins covered by the second gate stack serve as a channel region of the bulk finFET device. An epitaxial material is grown on exposed portions of the first fins which serves as source and drain regions of the SOI finFET device and an epitaxial material is grown on exposed portions of the second fins which serves as source and drain regions of the bulk finFET device.

In another aspect of the invention, a CMOS circuit is provided. The CMOS circuit includes a wafer having a first region having an SOI layer over a BOX and a second region having an epitaxial material; a SOI finFET device and a bulk finFET device. The SOI finFET device includes a plurality of first fins formed in the SOI layer; a first gate stack covering at least a portion of each of the first fins, wherein the portions of the first fins covered by the first gate stack serve as a channel region of the SOI finFET device; and an epitaxial material on portions of the first fins that serve as source and drain regions of the finFET device. The bulk finFET device includes a plurality of second fins formed in the epitaxial material; a second gate stack covering at least a portion of each of the second fins, wherein the portions of the second fins covered by the second gate stack serve as a channel region of the bulk finFET device; and an epitaxial material on portions of the second fins that serve as source and drain regions of the bulk finFET device.

A more complete understanding of the present invention, as well as further features and advantages of the present invention, will be obtained by reference to the following detailed description and drawings.

DETAILED DESCRIPTION OF PREFERRED EMBODIMENTS

FIGS. 1-11 are diagrams illustrating an exemplary methodology for fabricating a CMOS circuit. The CMOS circuit will include a silicon-on-insulator (SOI) finFET device and a bulk finFET device both formed on the same wafer. The bulk finFETs may be used in applications where a body tie and/or good thermal tie to the substrate is preferred.

The fabrication process begins with a SOI wafer. See FIG. 1. An SOI wafer typically includes a layer of a semiconductor material (also commonly referred to as a semiconductor-on-insulator layer or SOI layer) separated from a substrate by an insulator. When the insulator is an oxide (e.g., silicon dioxide ($SiO_2$)), it is commonly referred to as a buried oxide, or BOX. According to the present techniques, the SOI layer will serve as an active layer of the device in which the nanowires and fins will be patterned. Thus, the SOI layer will be referred to herein as an active layer.

Figure 1:
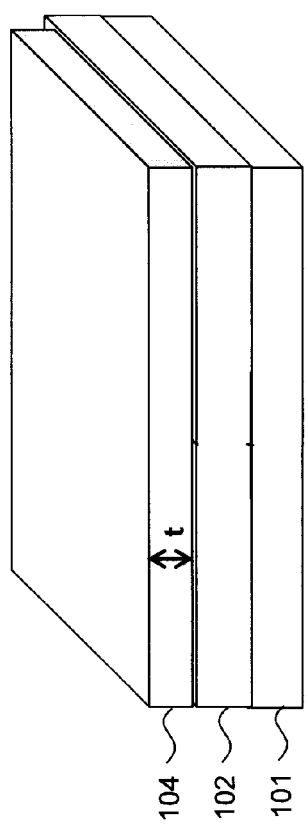
FIG. 1 is a three-dimensional diagram illustrating a starting structure for a complementary metal-oxide semiconductor (CMOS) circuit fabrication process, i.e., a silicon-on-insulator (SOI) wafer having an active layer separated from a substrate by a buried oxide (BOX) according to an embodiment of the present invention.

In the example shown in FIG. 1, the starting wafer includes an active layer 104 over a BOX 102. BOX 102 separates the active layer 104 from a substrate 101. According to an exemplary embodiment, active layer 104 is formed from a semiconducting material, such as silicon (Si) (e.g., crystalline silicon), silicon germanium (SiGe) or germanium (Ge). Thus, the active layer 104 may also be referred to as a "semiconductor device layer" or simply as a "semiconductor layer." Substrate 101 is formed from a semiconductor material, such as Si, Ge or SiGe.

Further, as will be apparent from the following description, a thickness t of active layer 104 will be equivalent to a final desired fin height for the SOI finFET devices. According to an exemplary embodiment, active layer 104 preferably has a thickness of from about 5 nanometers (nm) to about 40 nm. Commercially available SOI wafers typically have a thicker SOI layer. Thus, the SOI layer of a commercial wafer can be thinned using techniques such as oxidative thinning to achieve the desired active layer thickness for the present techniques.

Figure 2:
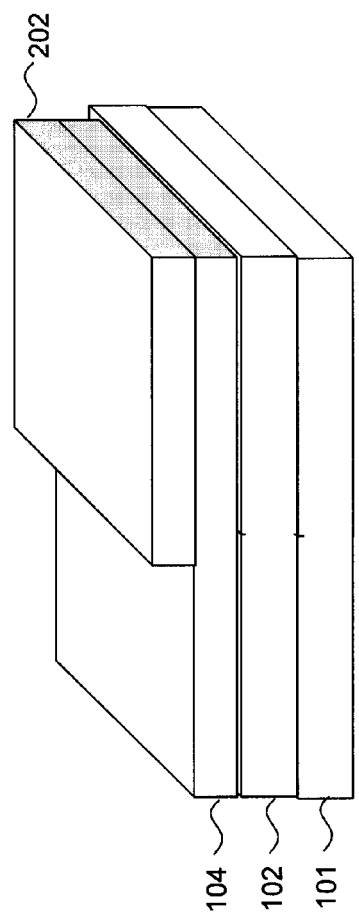
FIG. 2 is a three-dimensional diagram illustrating a hardmask is formed over a region of the wafer in which a SOI fin field-effect transistor (FET) device will be formed according to an embodiment of the present invention.

Next, as shown in FIG. 2, a hardmask 202 is formed over a portion of the active layer 104 in which the SOI finFET device will be formed. Portions of the active layer 104 and the BOX 102 not covered by the hardmask 202 will be removed (see below), thereby defining a region of the wafer in which the bulk finFET device will be formed.

According to an exemplary embodiment, hardmask 202 is formed from a nitride hardmask material, such as silicon nitride (SiN) which is blanket deposited onto the active layer 104 using, e.g., low-pressure chemical vapor deposition (LPCVD), and then patterned using lithography and nitride-selective reactive ion etching (RIE) techniques known in the art to open up holes in (i.e., remove) the nitride hardmask in the region of the wafer in which the bulk finFET device will be formed.

Figure 3:
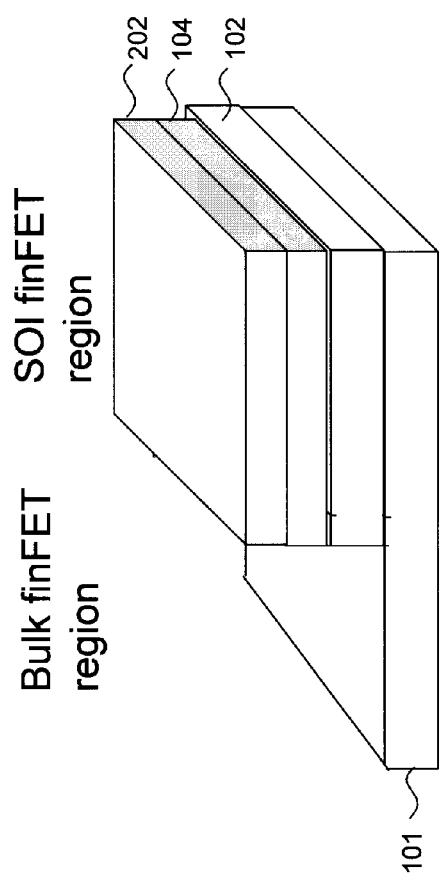
FIG. 3 is a three-dimensional diagram illustrating an etch having been performed to remove portions of the active layer and BOX not covered by the hardmask from a region of the wafer in which a bulk finFET device will be formed according to an embodiment of the present invention.
Figure 4:
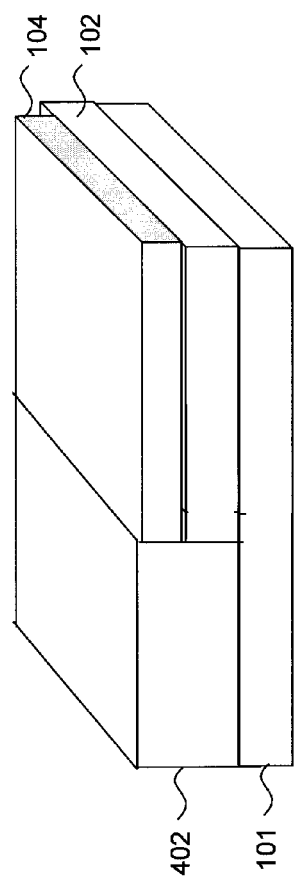
FIG. 4 is a three-dimensional diagram illustrating an epitaxial material having been grown in the bulk finFET device region of the wafer according to an embodiment of the present invention.
Figure 5:
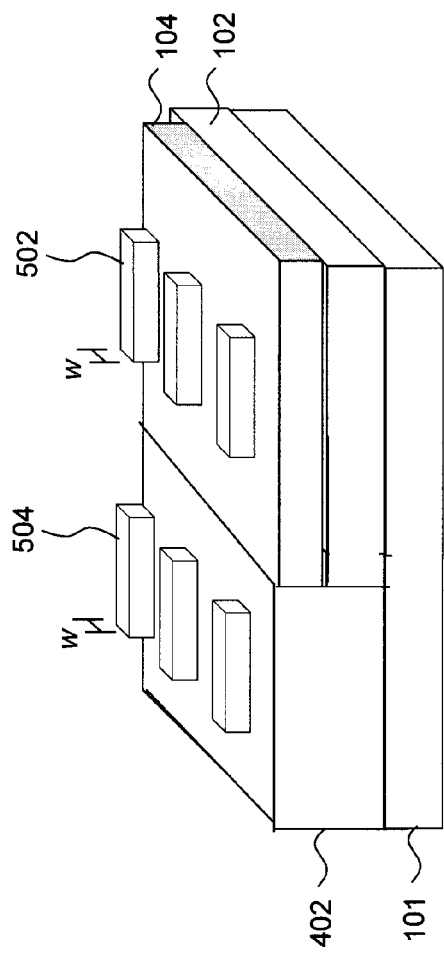
FIG. 5 is a three-dimensional diagram illustrating a first fin lithography hardmask having been formed on the SOI device region of the wafer and a second fin lithography hardmask having been formed on the bulk finFET device region of the wafer according to an embodiment of the present invention.
Figure 6:
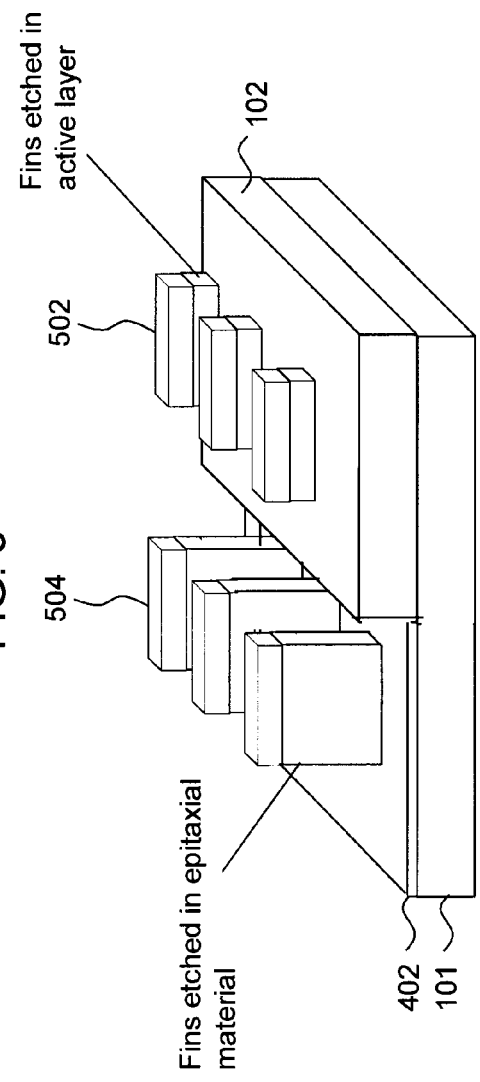
FIG. 6 is a three-dimensional diagram illustrating the first fin lithography hardmask having been used to etch fins in the active layer (in the SOI device region) and the second fin lithography hardmask having been used to etch fins in the epitaxial material (in the bulk finFET device region) according to an embodiment of the present invention.
Figure 7:
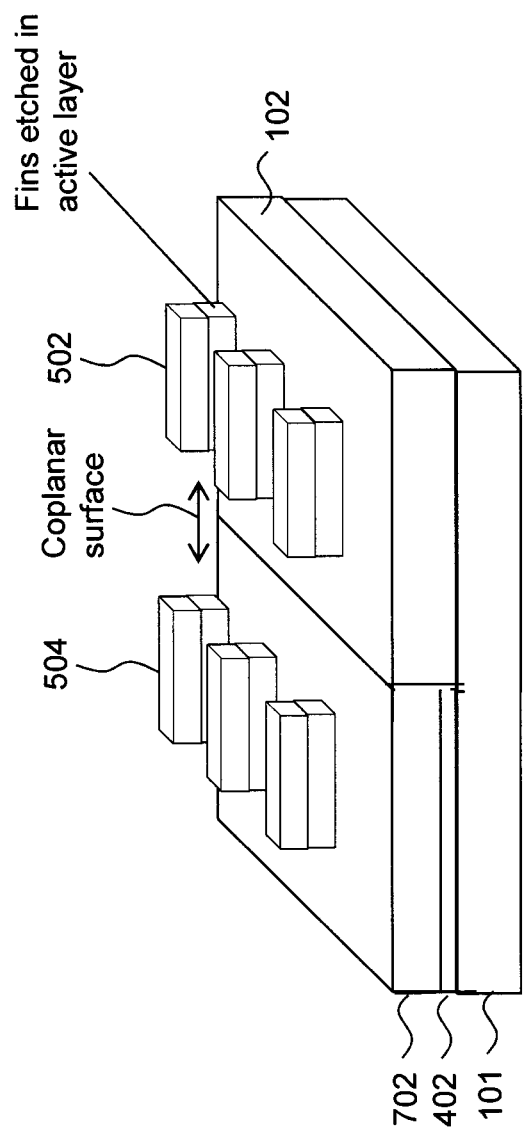
FIG. 7 is a three-dimensional diagram illustrating a planarizing dielectric having been deposited in the bulk finFET device region according to an embodiment of the present invention.

An etch is then performed to remove portions of the active layer 104 and BOX 102 not covered/masked by the hardmask 202. See FIG. 3. As shown in FIG. 3, the region of the wafer from which the active layer 104 and BOX 102 are removed will correspond to a region of the wafer in which the bulk finFET device will be formed and the region of the wafer where the active layer 104 and the BOX 102 remain intact (masked by the hardmask 202) will correspond to a region of the wafer in which the SOI finFET device will be formed.

According to an exemplary embodiment, the active layer 104 and BOX 102 are etched in this step using a two step reactive ion etching (RIE) process. For example, a first RIE step is employed to etch the active layer 104 followed by a second RIE step to etch the BOX 102. Hardmask 202 protects the SOI region of the wafer during this etching process.

As will be described in detail below, an epitaxial material will be grown to fill in the space left from removal of the active layer and the BOX in the bulk finFET region. The growth of the epitaxial material will be templated from the substrate 101. Therefore, the substrate 101 should be exposed in the bulk finFET region following the etching step. Following the etching in the bulk finFET region of the wafer, any remaining hardmask 202 can be removed, e.g., using chemical-mechanical polishing (CMP) or other suitable planarization process.

An epitaxial material 402 (e.g., epitaxial Si, Ge or SiGe) is then grown in the bulk finFET region of the wafer. See FIG. 4. As highlighted above, the growth of the epitaxial material 402 is templated from the exposed substrate 101 in this region.

According to an exemplary embodiment, the epitaxial material 402 is grown using a gaseous or liquid silicon precursor, as is known in the art. For instance, by way of example only, the epitaxial material 402 may be grown using vapor-phase epitaxy (VPE) with silane, dichlorosilane or trichlorosilane as source gases. Alternatively, molecular beam epitaxy (MBE) and/or liquid-phase epitaxy (LPE) as known in the art may be used.

CMP or other suitable etching process can then be used to planarize the epitaxial material 402 to be coplanar with the active layer 104. This will provide a planar layer on which the bulk finFET and SOI finFET devices can be fabricated.

Next, the bulk finFET and the SOI finFET devices are fabricated in their respective regions of the wafer. According to an exemplary embodiment, this device fabrication process involves using standard lithography techniques to pattern a first hardmask 502 which will be used pattern fins in the SOI region of the wafer (also referred to herein as a first fin lithography hardmask) and a second hardmask 504 which will be used to pattern fins in the bulk finFET of the wafer (also referred to as a second fin lithography hardmask). See FIG. 5.

Since the epitaxial material 402 is coplanar with the active layer 104, a continuous flat surface is provided over the two regions of the wafer. Accordingly, the hardmasks 502 and 504 can be formed from a common material, using a single hardmask fabrication process. By way of example only, a suitable hardmask material (e.g., a nitride material, such as SiN) can be blanket deposited over epitaxial material 402/active layer 104 and then patterned using a standard photolithography process with the footprint and location of hardmasks 502 and 504.

The fin lithography hardmasks will dictate the dimensions and spacing (i.e., pitch, or distance between fins) in the final (bulk or SOI) finFET devices. Thus, the fin lithography hardmask should be patterned with the desired dimensions and pitch commensurate with those of the fins. According to an exemplary embodiment, hardmasks 502 and 504 are patterned having the same fin width w.

Next, the hardmasks 502 and 504 are used to etch fins in the active layer 104 and in the epitaxial material 402, respectively. See FIG. 6. This etch may be performed using a RIE process. According to an exemplary embodiment, BOX 102 acts as an etch stop for the RIE fin etch into active layer 104. Without an equivalent etch stop, this RIE fin etch into the epitaxial material 402 will produce fins in the epitaxial material 402 (labeled "Fins etched in epitaxial material") that are taller than the fins produced in the active layer 104 (labeled "Fins etched in the active layer"). Thus, this RIE step can be end-pointed when a portion of the epitaxial material 402 remains (below the fins), such that the fins in this region are etched part way through the thickness of the epitaxial material 402. This exemplary embodiment is shown illustrated in FIG. 6. Alternatively, the RIE step can be end-pointed when none of the epitaxial material 402 remains (below the fins), such that the fins in this region are etched completely through the thickness of the epitaxial material 402. This configuration is not shown but would be the same as that shown in FIG. 6, except for the epitaxial material 402 would no longer be present (except for the epitaxial material in the fins). The remaining patterned hardmask may optionally be removed at this point, using for example CMP or other suitable planarization process. Alternatively, as shown in the figures, the remaining patterned hardmask may be removed later in the process.

Next, a layer of a dielectric 702 is deposited in the bulk finFET region. See FIG. 7. According to an exemplary embodiment, the dielectric 702 is an organic planarizing material which is spin-coated onto the structure. Suitable organic planarizing materials contain an aromatic cross-linkable polymer (e.g., naphthalene-based) in a solvent. Spin-coating ensures that the organic planarizing material sufficiently fills all of the gaps. A post-apply bake may then be performed to cross-link the organic planarizing material and bake off the solvent. According to an exemplary embodiment, the post-apply bake is conducted at a temperature of up to about 250 degrees Celsius (° C.), e.g., from about 200° C. to about 250° C. Alternatively, the dielectric 702 can be an oxide material (e.g., silicon oxide) deposited or grown in the bulk finFET region. A silicon oxide material can be deposited using a chemical vapor deposition (CVD) process, such as plasma-enhanced CVD (PECVD). A thermal oxide may also be grown in the bulk finFET region. With the above-described organic planarizing material or the oxide material (deposited or grown), formation of the dielectric 702 can be easily controlled to the bulk finFET region of the wafer.

Gate stacks 802 and 804 are then patterned on the fins in the SOI finFET and bulk finFET regions, respectively. See FIG. 8. The portions of the fins covered by the gate stacks will serve as channel regions of the respective FET devices. Gate stacks 802 and 804 each contain a dielectric (or combination of dielectrics), a first gate material (such as a metal(s)) and optionally a second gate material 808a/808b (such as a metal or doped polysilicon layer) that covers at least a portion of the fins, wherein the gate dielectric separates the gate materials 808a/808b from the fins. For clarity, in the following description and in the figures, the materials (i.e., dielectrics and gate materials) are given the designation 'a' (e.g., 808a) when reference is being made to the gate stack 802 and the designation 'b' (e.g., 808b) when reference is being made to the gate stack 804. However, according to an exemplary embodiment, the materials given the designations 'a' and 'b' are the same materials (i.e., have the same composition as one another) since they are formed at the same time (in the same step). For example, as will be apparent from the following description, the second gate material 808a in gate stack 802 and the second gate material 808b in gate stack 804 are preferably formed from the same material that is deposited over both of the gate stacks and then patterned.

According to an exemplary embodiment, gate stacks 802 and 804 are formed by depositing a conformal gate dielectric film 902a and 902b such as silicon dioxide ($SiO_2$), silicon oxynitride (SiON), or hafnium ($HfO_2$) (or other hi-K material) around the fins. See FIG. 9A which provides a view of a cross-sectional cut (i.e., along line A-A') through a portion of gate stack 802 and FIG. 9B which provides a view of a cross-sectional cut (i.e., along line B-B') through a portion of gate stack 804.

Optionally, a second conformal gate dielectric film 904a and 904b that includes, for example, $HfO_2$, may be applied over gate dielectric film 902a and 902b, respectively. A (first) gate material 906a and 906b is then deposited over the conformal gate dielectric film 902a and 902b (or over optional second conformal gate dielectric film 904a and 904b). According to an exemplary embodiment, the gate material 906a and 906b is a conformal metal gate film that includes, for example, tantalum nitride (TaN) or titanium nitride (TiN).

Figure 8:
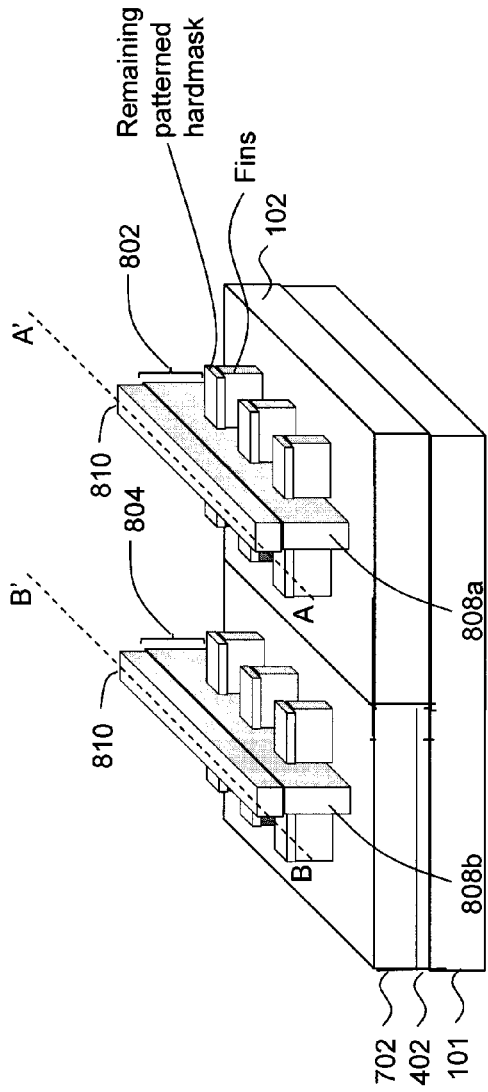
FIG. 8 is a three-dimensional diagram illustrating gate stacks having been patterned on the fins in the SOI finFET device region and bulk finFET device region according to an embodiment of the present invention.
Figure 9B:
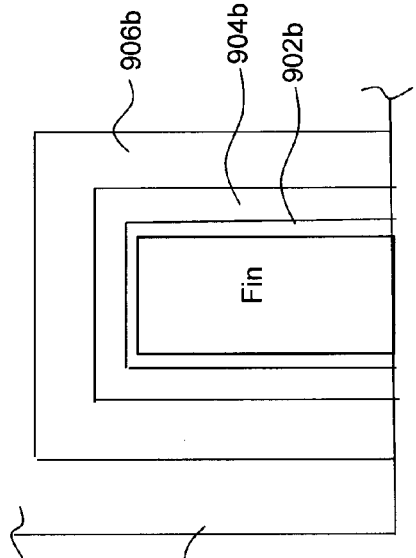
FIG. 9B is a cross-sectional diagram illustrating a cut through a gate stack in the SOI finFET device region according to an embodiment of the present invention.
Figure 9A:
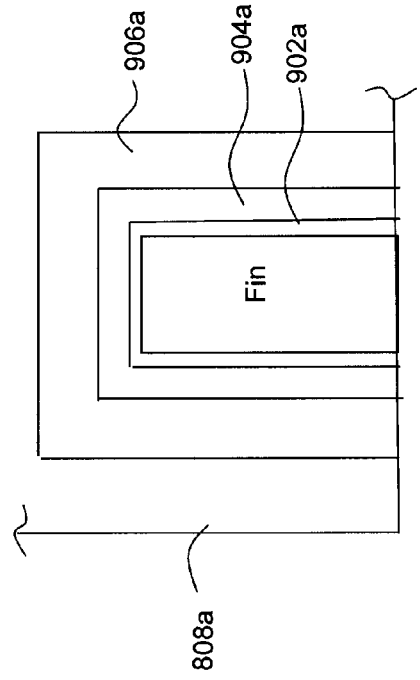
FIG. 9A is a cross-sectional diagram illustrating a cut through a gate stack in the bulk finFET device region according to an embodiment of the present invention.
Figure 10:
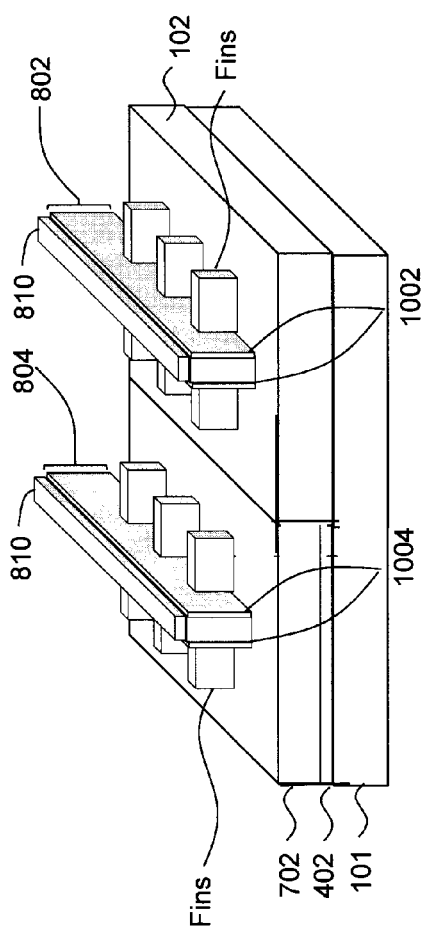
FIG. 10 is a three-dimensional diagram illustrating spacers having been formed on opposite sides of the gate stacks according to an embodiment of the present invention.

Optionally, a second gate material such as doped polysilicon or metal may then be blanket deposited onto the structure (i.e., over the gate material 906a and 906b so as to surround the fins). By way of reference to FIG. 8, hardmasks 810 (e.g., a nitride hardmask, such as SiN) may then be formed on the second gate material, wherein the hardmasks correspond to gate lines of the bulk finFET and the SOI finFET devices. Standard patterning techniques can be used to form the hardmasks 810. The gate material(s) and dielectric(s) are then etched by directional etching that results in straight sidewalls of the gate stacks 802 and 804, as shown in FIG. 8. The second gate material, by this etching step, forms second gate material 808a and 808b over gate stacks 802 and 804, respectively. If present, any remaining hardmask on the fins is also removed by the etching (see FIG. 10).

Spacers 1002 are formed on opposite sides of gate stack 802 and spacers 1004 are formed on opposite sides of gate stack 804. See FIG. 10. According to an exemplary embodiment, spacers 1002 and 1004 are formed by depositing a blanket dielectric film such as silicon nitride and etching the dielectric film from all horizontal surfaces by RIE.

Figure 11:
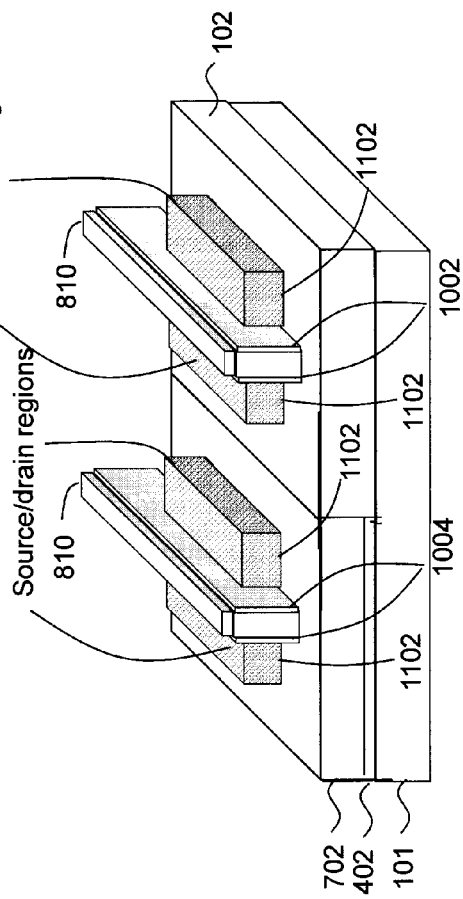
FIG. 11 is a three-dimensional diagram illustrating a selective epitaxial material having been grown to thicken exposed portions of the fins according to an embodiment of the present invention.

A selective epitaxial material such as silicon (Si), germanium (Ge), silicon germanium (SiGe), or silicon carbide (SiC) 1102 is then grown to thicken the exposed portions of the fins (i.e., those portions not covered by a gate stack or spacers). See FIG. 11. As shown in FIG. 11, the epitaxial silicon may merge the fins together with epitaxial silicon. The growth process might involve epitaxially growing, for example, in-situ doped Si or SiGe that may be either n-type or p-type doped. The in-situ doped epitaxial growth process forms source and drain regions of the FinFET devices (see FIG. 11). By way of example only, a chemical vapor deposition (CVD) reactor may be used to perform the epitaxial growth. For example, for silicon epitaxy, precursors include, but are not limited to, $SiCl_4$, $SiH_4$ combined with HCL. The use of chlorine allows selective deposition of silicon only on exposed silicon. A precursor for SiGe growth may be $GeH_4$, which may obtain deposition selectivity without HCL. Precursors for dopants may include $PH_3$ or $AsH_3$ for n-type doping and $B_2H_6$ for p-type doping. Deposition temperatures may range from about 550° C. to about 1,000° C. for pure silicon deposition, and as low as 300° C. for pure Ge deposition.

Figure 12:
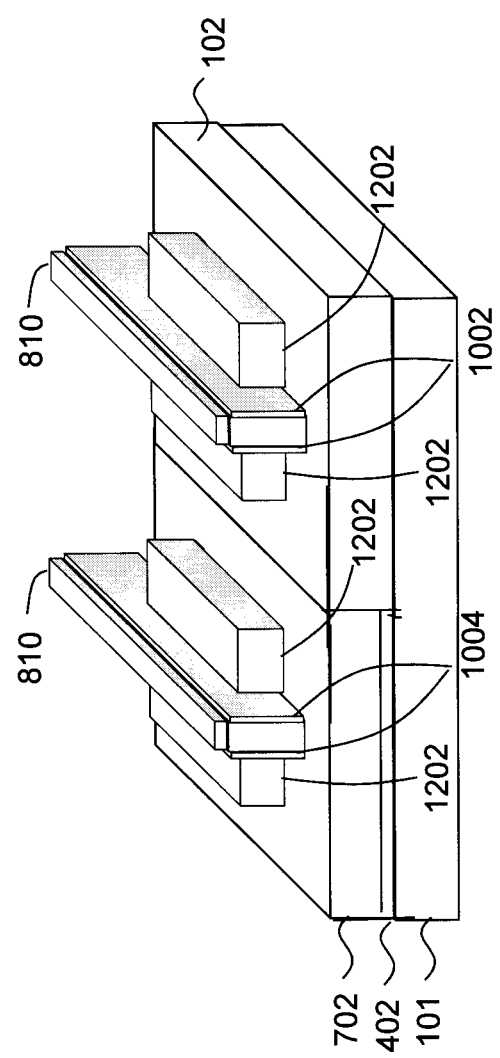
FIG. 12 is a three-dimensional diagram illustrating a contact material having been formed on the exposed epitaxial material according to an embodiment of the present invention.

Finally, a contact material such as a silicide, germanide, germanosilicide, etc. 1202 is formed on the exposed epitaxial material 1102. See FIG. 12. Examples of contact materials include, but are not limited to, nickel silicide or cobalt silicide. When nickel (Ni) is used, the nickel silicide phase is formed due to its low resistivity. By way of example only, formation temperatures can be from about 400° C. to about 600° C. Once the contact material formation is performed, capping layers and vias for connectivity (not shown) may be formed.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for fabricating a complementary metal-oxide semiconductor (CMOS) circuit having a SOI finFET device and a bulk finFET device, the method comprising the steps of:
   providing a wafer having an active layer separated from a substrate by a buried oxide (BOX), wherein the wafer has at least a first region and a second region;
   removing portions of the active layer and the BOX in the second region of the wafer so as to expose the substrate;
   growing an epitaxial material in the second region of the wafer templated from the substrate;
   forming a first fin lithography hardmask on the active layer in the first region of the wafer and a second fin lithography hardmask on the epitaxial material in the second region of the wafer;
   etching a plurality of first fins in the active layer using the first fin lithography hardmask and a plurality of second fins in the epitaxial material using the second fin lithography hardmask;
   forming a first gate stack covering at least a portion of each of the first fins and a second gate stack covering at least a portion of each of the second fins, wherein the portions of the first fins covered by the first gate stack serve as a channel region of the SOI finFET device and the portions of the second fins covered by the second gate stack serve as a channel region of the bulk finFET device; and
   growing an epitaxial material on exposed portions of the first fins which serves as source and drain regions of the SOI finFET device and an epitaxial material on exposed portions of the second fins which serves as source and drain regions of the bulk finFET device.

2. The method of claim 1, wherein the active layer comprises a semiconducting material selected from the group consisting of: silicon, germanium and silicon germanium.

3. The method of claim 1, wherein the active layer has a thickness of from about 5 nm to about 40 nm.

4. The method of claim 1, further comprising the step of:
   forming a hardmask on the active layer in the first region of the wafer.

5. The method of claim 1, wherein the step of removing portions of the active layer and the BOX in the second region of the wafer comprises the step of:
   etching the active layer and the BOX using a reactive ion etching process.

6. The method of claim 1, wherein the epitaxial material grown in the second region of the wafer comprises epitaxial silicon, epitaxial germanium or epitaxial silicon germanium.

7. The method of claim 1, further comprising the step of:
   planarizing the epitaxial material grown in the second region of the wafer to be coplanar with the active layer.

8. The method of claim 1, further comprising the step of:
   forming spacers on opposite sides of the first gate stack and on opposite sides of the second gate stack.

9. The method of claim 1, wherein the step of forming the first gate stack and the second gate stack comprises the steps of:
   depositing a gate dielectric over the first fins and the second fins;
   depositing polysilicon over the gate dielectric; and
   patterning the polysilicon and the gate dielectric to form the first gate stack and the second gate stack.

10. The method of claim 1, wherein the epitaxial material grown on the exposed portions of the first fins and on the exposed portions of the second fins comprises epitaxial silicon, epitaxial germanium or epitaxial silicon germanium.

11. The method of claim 1, further comprising the step of:
    forming a silicide, germanide or germanosilicide on the epitaxial material grown on the exposed portions of the first fins and on the exposed portions of the second fins.

12. The method of claim 1, further comprising the step of:
    depositing a dielectric on the second region of the wafer after the etching step has been performed.

13. The method of claim 4, wherein the step of forming the hardmask on the active layer in the first region of the wafer comprises the steps of:
    depositing a hardmask material onto the active layer; and
    removing the hardmask material from the second region of the wafer.

14. The method of claim 13, wherein the hardmask material is deposited onto the active layer using low-pressure chemical vapor deposition.

15. The method of claim 13, wherein the hardmask material comprises a nitride hardmask material.

16. The method of claim 7, wherein the planarizing step is performed using chemical mechanical polishing.

17. The method of claim 11, wherein the silicide, germanide or germanosilicide is formed using a metal selected from the group consisting of nickel, platinum, cobalt and alloys thereof.

18. A CMOS circuit, comprising:
    a wafer having a first region comprising an SOI layer over a BOX and a second region comprising an epitaxial material;
    a SOI finFET device comprising:
       a plurality of first fins formed in the SOI layer;
       a first gate stack covering at least a portion of each of the first fins, wherein the portions of the first fins covered by the first gate stack serve as a channel region of the SOI finFET device;
       an epitaxial material on portions of the first fins that serve as source and drain regions of the finFET device;
    a bulk finFET device comprising:
       a plurality of second fins formed in the epitaxial material;
       a second gate stack covering at least a portion of each of the second fins, wherein the portions of the second fins covered by the second gate stack serve as a channel region of the bulk finFET device; and
       an epitaxial material on portions of the second fins that serve as source and drain regions of the bulk finFET device.

19. The CMOS circuit of claim 18, further comprising spacers on opposite sides of the first gate stack and on opposite sides of the second gate stack.

20. The CMOS circuit of claim 18, further comprising a silicide, germanide or germanosilicide on the epitaxial material on the first fins and on the epitaxial material on the second fins.

21. The CMOS circuit of claim 20, wherein the silicide, germanide or germanosilicide comprises a metal selected from the group consisting of nickel, platinum, cobalt and alloys thereof.

* * * * *